United States Patent
Paz-Pujalt et al.

[11] Patent Number: 5,525,380
[45] Date of Patent: Jun. 11, 1996

[54] METHOD OF MAKING A DEVICE FOR CONVERTING INFRARED RADIATION

[75] Inventors: Gustavo R. Paz-Pujalt; James M. Chwalek; Anna L. Hrycin; Dilip K. Chatterjee, all of Rochester; Liang-Sun Hung, Webster, all of N.Y.

[73] Assignee: Eastman Kodak Company, Rochester, N.Y.

[21] Appl. No.: 432,281

[22] Filed: May 1, 1995

Related U.S. Application Data

[62] Division of Ser. No. 186,400, Jan. 25, 1994.
[51] Int. Cl.[6] ............................................. C23C 8/00
[52] U.S. Cl. ..................... 427/585; 427/162; 427/248.1; 427/595
[58] Field of Search .................. 427/586, 596, 427/248.1, 585, 162

*Primary Examiner*—Bernard Pianalto
*Attorney, Agent, or Firm*—Raymond L. Owens

[57] ABSTRACT

An amorphous upconversion phosphor comprising barium fluoride a combination of rare-earth fluorides including yttrium and lanthanum and dopants, and a waveguide thereof on a substrate selected to have a refractive index lower than a thin film of the phosphor material or any other substrate with an appropriate buffer layer of lower refractive index that the film wherein infrared radiation and visible light are convened to ultraviolet and visible light The amorphous upconversion phosphor is deposited at temperatures low enough to permit integration into semiconductor materials.

1 Claim, 1 Drawing Sheet

METHOD OF MAKING A DEVICE FOR CONVERTING INFRARED RADIATION

This is a divisional of application Ser. No. 186,400, filed Jan. 25, 1994.

FIELD OF THE INVENTION

The present invention relates to devices for convening relatively long wavelengths into a plurality of components, each having a desired wavelength.

BACKGROUND OF THE INVENTION

Metal fluoride phosphors have been known for some time (F. Auzel, D. Pecile, Journal of Luminescence, 8, 32–43, 1973). These phosphors may be used for Upcoversion of infrared (IR) radiation to various forms of visible light. It was not until the development and commercialization of compound semiconductor diode lasers, that emit laser radiation at IR frequencies, that interest in these phosphors reappeared More specifically there is a great deal of interest in thin film articles, based on these phosphors, that can be optically coupled to said laser diodes to produce visible light. ZBLAN (Zr, Ba, La, Al, Nd), AZF (Al, Zr, Y, etc), and AYF (AL, Y, Mg, etc.), collectively known as heavy metal fluoride glass phosphors, are some of the phosphors that have been identified as effective upconversion phosphors. These types of material are difficult to deposit in thin film form because of the large variance in the vapor pressures, and different chemical stability of the constituent fluorides. When depositing mixed alkaline-earth metal fluorides and rare earth metal fluorides, this can result in polycrystalline films with the possible contamination of carbon and oxygen furthermore their processing required high temperatures usually above 500° C. (G.R. Paz-Pujalt, U.S. Pat. No. 5,051,278, issued Jun. 23, 1992 entitled Method of Forming Metal Fluoride Films by the Decomposition of Metalloorganic Compounds in the Presence of a Fluorinating Agent).

SUMMARY OF THE INVENTION

It is an object of the present invention to provide low loss amorphous phosphor thin films of upconversion phosphors and method of making same.

Another object is to provide a thin film low loss phosphor that may act as a host to a plurality of rare earth dopants selected to obtain specific upconversion wavelengths.

Another object is to provide a way of integrating an active fight emitting material LASER to a phosphor waveguide to produce UV and visible light based on upconversion.

Another object is to provide a way to overcome problems like scattering, optical losses, birefringence, and amorphous phosphor thin film 12 substrate 10 lattice mismatch associated with polycrystalline thin films.

This object is achieved by a device for converting invisible light to visible light, comprising a substrate 10 and an amorphous phosphor thin film 12 including an alkaline earth fluoride, and a mixture of rare-earth fluorides on the substrate 10 and having an index of refraction greater than the substrate 10 and which is selected to convert infrared radiation or visible radiation into ultraviolet and visible radiation.

In accordance with the invention, a device for converting invisible radiation and visible light to ultraviolet and visible light, comprising a substrate 10 and a amorphous phosphor thin film 12 including an alkaline earth fluoride, and a mixture of rare-earth fluorides on the substrate 10 and having an index of refraction greater than the substrate 10 and which is selected to convert infrared radiation or visible radiation into ultraviolet, blue, green and red visible light. Deposition by electron beam evaporation and by thermal evaporation onto a substrate 10 held at low temperature permits integration into semiconductor substrates.

ADVANTAGES

Advantages of this invention are that it provides low loss thin film waveguides; the films are optically isotropic thus the interaction of the amorphous phosphor thin film 12 with the excitation pump shows no polarization or direction dependence, problems associated with birefringence in crystalline materials are also eliminated; low deposition temperatures (<240° C.) permit the utilization of a broad range of substrates including polymeric substrates; and low processing temperature eliminates amorphous phoshor thin film 12 substrate 10 interactions and permits deposition onto semiconductor material substrates.

DETAILED DESCRIPTION OF THE INVENTION

Figure 1:
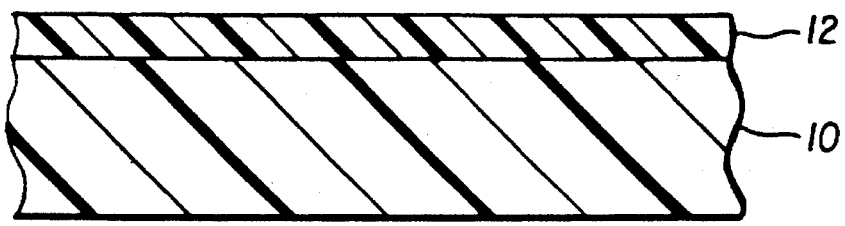
FIG. 1 shows a side view of a multiwavelength upconversion phosphor waveguide on a substrate in accordance with this invention.
Figure 2:
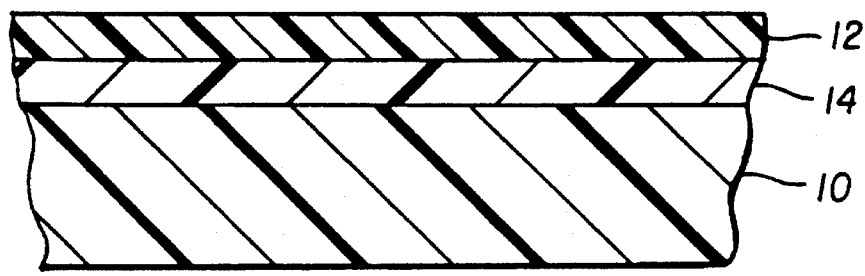
FIG. 2 shows a side view of a multiwavelength upconversion phosphor waveguide on an interfacial layer on a substrate.

Turning now to FIGS. 1 and 2, where two separate embodiments of this invention are shown. In FIG. 1 a substrate 10 made of fused silica, preferably barium fluoride, fused silica, is provided. Upon this substrate 10 is an amorphous phosphor thin film 12 which has an index of refraction greater than the index of refraction of the substrate 10. By thin film is meant a film which has a thickness of 2 microns or less. We have determined that the amorphous phosphor thin film 12 should be amorphous because when it is polycrystalline scattering losses and lattice structure mismatches are of concern.

In FIG. 2 another embodiment of the invention is shown. There is also provided a substrate 10 and an amorphous phosphor thin film 12 interposed between the substrate 10 and the amorphous phosphor thin film 12 is an interfacial buffer layer 14 formed of silicon oxide. We have determined that the buffer layer is advantageous because the buffer layer is selected to have a lower index of refraction than the amorphous phosphor thin film 12. The substrate 10 can then be selected from a wider range of materials which have a higher index of refraction such as, for example, gallium arsenide. In fact, gallium arsenide will typically have a higher index of refraction that the amorphous phosphor thin film 12.

Figure 3:
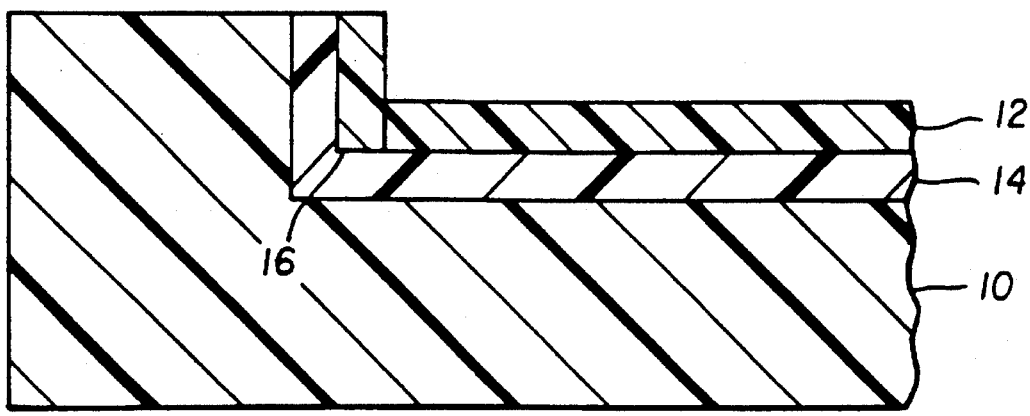
FIG. 3 shows a side view of a multiwavelength upconversion phosphor conformal to an interfacial layer conformal to a microfabricated step on a substrate.

In FIG. 3 another embodiment of the invention is shown. There is also provided a substrate 10 with a microfabricated feature in the form of a step 16, and a amorphous phosphor thin film 12 interposed between the substrate 10 and the amorphous phosphor thin film 12 is a buffer layer 14 formed of silicon oxide. We have determined that the buffer layer coats the substrate 10 and its features in a conformal coating on the step 16. The amorphous phosphor film 12 also coats the interfacial layer in a conformal fashion as shown in FIG. 3. We have found this advantageous because the conformal buffer layer and the conformal amorphous phosphor thin film 12 permit integration and coupling into an active light emitting material like III-V-type semiconductor.

With respect to the amorphous phosphor thin film 12, we have discovered a family of glass upconversion phosphors of the following composition:

Ba-Ln-F where Ln may be Y, Yb, Ho, Er, Tm or a combination thereof. One of the advantages of these family of phosphors over heavy metal fluoride phosphors is that the vapor pressures for the constituent fluorides can be closely matched, making them ideal for thermal deposition and electron-beam (e-beam) deposition to form thin films. Thin glassy films of these phosphors may be deposited onto substrates that have lower refractive indices than said phosphors (~1.54) resulting in a formation of waveguides. The refractive indices of $BaF_2$ (n=1.473), $SiO_2$ (n=1.467) fall below the index of the described phosphors compounds, therefore deposition of amorphous phosphor thin films 12 onto any of these substrates would result in the formation of thin film waveguides. The invention provides an effective upconversion glassy alkaline earth rare fluoride phosphor thin film waveguide that when optically coupled to a pump source emitting radiation in the IR region or in the range of 645 nm to 665 nm or 675 nm to 685 nm converts this radiation into visible light and ultraviolet radiation. It also provides for a low temperature fabrication process. The spectral distribution of the visible light obtained can be classified into four main groups based on their wavelength: 350–370 nm (UV); 440–480 nm (blue); 500–550 nm (green); and 600–650 nm (red). The efficiency of conversion and the specific wavelength intensities among these groups can be optimized by varying the ratios of the constituting elements, and by processing parameters. The radiation produced can be used for printing or recording onto photographic media for interrogating substrates with active layers that respond to irradiation in clinical diagnostic equipment for example and other sensors. Planar waveguides can be physically or chemically modified, to become channel waveguides, by creating channels, altering the chemical composition or other well known methods of channel waveguide fabrication. When the appropriate coatings or gratings are designed onto the thin film waveguides light amplification by stimulated emission resonance (LASER) activity can be obtained.

This invention relates to glassy metal fluoride thin films on a substrate 10. The glassy material comprising an alkaline-earth fluoride and a combination of rare earth fluorides. Thin amorphous phosphor thin films 12 are deposited by electron beam evaporation or thermal evaporation from a melt of the corresponding fluorides onto a substrate 10. The resulting film is glassy and when appropriately constituted behaves as a photon addition phosphor converting invisible IR radiation and visible radiation into visible and UV output wavelengths. Preferred composition of the glassy films is Ba-Ln-F where Ln can be= Y, Yb, Dy, Ho, Er, Tm, Lu. Films were deposited by electron beam evaporation and by thermal evaporation under vacuum at a pressure of $5\times10^{-6}$ torr. The substrate 10 was maintained at <240° C. In some cases an ion beam was fired at the substrate 10 during film growth (ion assisted deposition (LAD)) in order to improve certain characteristics of the film. The preferred substrates 10 are primarily those that can withstand the deposition temperature and those have the correct index of refraction in order to form waveguides.

The list of substrates includes, but is not limited to, the following:

| fused silica | (n = 1.457 @ .59 μm) |
|---|---|
| barium fluoride | (n = 1.473 @ .546 μm) |
| magnesium fluoride | (n = 1.378 @ .59 μm) |
| calcium fluoride | (n = 1.424 @ 2.0 μm) |
| strontium fluoride | (n = 1.439 @ .546 μm) |
| lithium fluoride | (n = 1.379 @ 2.0 μm) |

These substrates may be used as single crystals or in their polycrystalline form or as films of the appropriate thickness deposited onto other substrates. Other substrates and amorphous phosphor thin film 12 combinations include silicon oxide, calcium fluoride, magnesium fluoride, barium fluoride deposited on Si or III-V semiconductors comprised of (III= Al, Ga, In)-(V=N, P, As). Other substrates may be polymeric materials that can withstand the deposition temperature.

EXAMPLE 1

A mixture of $BaF_2$, $YF_3$, $YbF_3$ and $TmF_3$ powders were weighed and mixed in the molar proportions of 1:1:.99:.01. After mechanical mixing the resulting mixture was used for depositing amorphous phosphor thin films 12 by electron beam evaporation onto fused silica substrates. A film thickness of 0.25 μm was obtained when the deposition lasted for 2 hours and the substrate 10 temperature was 240° C. The resulting film was amorphous to x-ray diffraction measurements. When irradiated by 960 μm IR light the film produced visible light. The produced radiation had the following composition: 350–370 nm (UV); 440–480 nm (blue); 500–550 nm (green); and 630–680 nm (red).

EXAMPLE 2

A mixture of $BaF_2$, $YF_3$, $YbF_3$ and $TmF_3$ powders were weighed and mixed in the molar proportions of 1:1:.99:.01. After mechanical mixing the resulting mixture was used for depositing thin films by electron beam evaporation onto fused silica substrates. A film thickness of 1.0 μm was obtained. The film was deposited with ion assisted deposition. The resulting film was amorphous to x-ray diffraction measurements. When irradiated by 647 nm visible light the film produced visible and UV radiation. The produced radiation had the following composition 350–370 nm (UV), 440–480 nm (blue), 500–550 nm (green), and 630–680 nm (red).

EXAMPLE 3

A mixture of $BaF_2$, $YF_3$, $YbF_3$ and $TmF_3$ powders were weighed and mixed in the molar proportions of 1:1:.99:.01. After mechanical mixing the resulting mixture was used for depositing thin films by thermal evaporation as described above. 1 μm of material was deposited onto fused silica. The resulting film was amorphous to x-ray diffraction. The thin film so produced was optically coupled to a laser beam at 633 nm wavelength via a Metricon prism coupling system. One mode coupled into the thin film indicating that the film waveguides.

EXAMPLE 4

A mixture of $BaF_2$, $YF_3$, $YbF_3$, $ErF_3$ and $TmF_3$ powders were weighed and mixed in the molar proportions of 1:1:0.99:0.005:0.005. After mechanical mixing the resulting mixture was used for depositing thin films by thermal evaporation onto fused silica substrates and $BaF_2$ wafers cut along the [100]direction. A film thickness of 1 μm was obtained when the deposition lasted for 2 hours and the substrate 10 temperature was 240° C. The resulting film was amorphous (glassy) to x-ray diffraction measurements. When irradiated by 960 μm IR radiation the film produced UV and visible radiation. The produced radiation had the following composition 350–370 nm (UV), 440–480 nm (blue), 500–550 nm (green), and 630–680 nm (red)

EXAMPLE 5

A mixture of $BaF_2$, $YF_3$, $YbF_3$, $ErF_3$ and $TmF_3$ powders were weighed and mixed in the molar proportions of 0.77-0.10-0,10-0.03. After mechanical mixing the resulting mixture was used for depositing thin films by thermal evaporation. A fused silica substrate 10 was coated by thermal evaporation with a thin layer of approximately 0.25 μm of $MgF_2$ (refractive index n=1.378). Onto this coated substrate 10 was coated a 2 μm layer of the mixture described above. The substrate 10 was maintained at a temperature of 240° C. The resulting film was amorphous to x-ray diffraction. When irradiated by 960 μm IR radiation the film produced UV and visible radiation. The produced radiation had the following composition 350–370 nm (UV), 440–480 nm (blue), 500–550 nm (green), and 630–680 nm (red).

EXAMPLE 6

A mixture of $BaF_2$, $YF_3$, $YbF_3$ and $TmF_3$ powders were weighed and mixed in the molar proportions of 1:1:0.99:0.01. After mechanical mixing the resulting mixture was used for depositing thin films by thermal evaporation as described above. A fused silica substrate 10 was coated by thermal evaporation with a thin layer of approximately 0.25 μm of $SiO_2$ (n=1.456). Onto this coated substrate 10 was coated a ~2 μm layer of the mixture described above. The substrate 10 was maintained at a temperature of 240° C. The resulting film was amorphous to x-ray diffraction. The thin film so produced was optically coupled to a laser beam at 633 nm wavelength via a Metricon prism coupling system. Various modes coupled into the thin film indicating that the film waveguides. When irradiated by 960 μm IR radiation the film produced UV and visible radiation. The produced radiation had the following composition 350–370 nm (UV), 440–480 nm (blue), 500–550 nm (green), and 630–680 nm (red) visible light.

EXAMPLE 7

A mixture of $BaF_2$, $YF_3$, $YbF_3$ and $TmF_3$ powders were weighed and mixed in the molar proportions of 1:1:0.99:0.01. After mechanical mixing the resulting mixture was used for depositing thin films by thermal evaporation as described above. A silicon (100) substrate 10 was coated by thermal evaporation with a thin layer of approximately 0.25 μm of $SiO_2$ (n=1.456). Onto this coated substrate 10 was coated a ~2 μm layer of the mixture described above. The substrate 10 was maintained at a temperature of 240° C. The resulting fluoride thin film was amorphous to x-ray diffraction. Prism coupling measurements indicated that a plurality of light modes could be coupled into the waveguide.

EXAMPLE 8

A mixture of $BaF_2$, $YF_3$, $YbF_3$ and $TmF_3$ powders were weighed and mixed in the molar proportions of 1:1:0.99:0.01. After mechanical mixing the resulting mixture was used for depositing thin films by thermal evaporation as described above. A gallium arsenide (III-V-type) compound semiconductor substrate 10 with microfabricated features (FIG. 3) was coated by thermal evaporation with a thin layer of approximately 0.25 μm of $SiO_2$ (n=1.456). Onto this coated substrate 10 was coated a ~2 μm layer of the mixture described above. The substrate 10 was maintained at a temperature of 240° C. The resulting fluoride thin film was amorphous to x-ray diffraction. Scanning electron micrographs showed a conformal relationship between the interfacial film, the substrate 10 and the fluoride thin film.

EXAMPLE 9

A mixture of $BaF_2$, $YF_3$, $YbF_3$, $ErF_3$ and $TmF_3$ powders were weighed and mixed in the molar proportions of 1:1:0.99:0.005:0.005. After mechanical mixing the resulting mixture was used for depositing thin films by thermal evaporation onto a $BaF_2$ wafer oriented in the (100) direction. A film thickness of 1 μm was obtained when the deposition lasted for 2 hours and the substrate 10 temperature was 240° C. The resulting film was amorphous to x-ray diffraction measurements. After rapid thermal annealing treatment at 900° C. for 20 sec. x-ray diffraction revealed an film oriented in the a- crystallographic direction. When irradiated by 960 μm IR radiation the film produced UV and visible radiation. The produced radiation had the following composition 350–370 nm (UV), 440–480 nm (blue), 500–550 nm (green), and 630–680 nm (red) visible light.

The invention has been described in detail with particular reference to certain preferred embodiments thereof, but it will be understood that variations and modifications can be effected within the spirit and scope of the invention.

PARTS LIST 10 substrate
12 film
14 buffer layer
16 step

We claim:

1. A method of making a device for converting IR into red, green, blue, and ultraviolet light comprising:

providing a substrate and forming by electron beam deposition or thermal evaporation an amorphous phosphor film at a temperature of less than 240° C., such film being formed of an alkaline earth fluoride, and/or a mixture of rare-earth fluorides on the substrate and having an index of refraction greater than the substrate and which is selected to convert invisible IR radiation into ultraviolet, blue, green and red light wherein the wavelength of the ultraviolet is 350–370 nm, blue light is 440–490 nm, the green light is 500–560 nm and the red light 630–680 nm.

* * * * *

UNITED STATES PATENT AND TRADEMARK OFFICE
CERTIFICATE OF CORRECTION

PATENT NO. : 5,525,380
DATED : June 11, 1996
INVENTOR(S) : Gustavo R. Paz-Pujalt, et al It is certified that error appears in the above-indentified patent and that said Letters Patent is hereby corrected as shown below:

Abstract, line 8, "convened" should be --converted --.

Signed and Sealed this

Twelfth Day of November, 1996

Attest:

BRUCE LEHMAN

*Attesting Officer*       *Commissioner of Patents and Trademarks*